(12) United States Patent
Holzschuh (10) Patent No.: US 6,436,519 B2
(45) Date of Patent: Aug. 20, 2002

(54) CUTTING TOOL WITH MULTILAYER, WEAR-RESISTANT COATING

(75) Inventor: Helga Holzschuh, Mehrstetten (DE)

(73) Assignee: Walter AG, Tübingen (DE)

(*) Notice: Subject to any disclaimer, the term of this patent is extended or adjusted under 35 U.S.C. 154(b) by 0 days.

(21) Appl. No.: 09/745,955

(22) Filed: Dec. 22, 2000

(30) Foreign Application Priority Data

Dec. 22, 1999 (DE) .......................... 199 62 056

(51) Int. Cl.$^7$ ............................... C23C 14/06
(52) U.S. Cl. ............... 428/216; 428/428; 428/212; 428/336; 428/697; 428/698; 428/699; 428/701; 428/702
(58) Field of Search ................ 428/212, 216, 428/699, 697, 698, 336, 701, 702

(56) References Cited

U.S. PATENT DOCUMENTS

| | | | |
|---|---|---|---|
| 4,341,834 A | | 7/1982 | Kikuchi et al. |
| 4,490,191 A | | 12/1984 | Hale |
| 4,501,786 A | | 2/1985 | Hale |
| 4,525,415 A | * | 6/1985 | Porat .......................... 428/336 |
| 4,714,660 A | * | 12/1987 | Gates, Jr. .................... 428/472 |
| 5,650,201 A | | 7/1997 | Tompa |
| 5,840,435 A | | 11/1998 | Lieber et al. |
| 5,871,850 A | * | 2/1999 | Moriguchi et al. ......... 428/698 |
| 6,221,469 B1 | * | 4/2001 | Ruppi ........................ 428/216 |

FOREIGN PATENT DOCUMENTS

| | | | |
|---|---|---|---|
| EP | 709483 | * | 5/1996 |
| EP | 0 736 615 A2 | | 10/1996 |
| EP | 0 980 917 A2 | | 2/2000 |
| JP | 54-158775 | * | 12/1979 |
| JP | 54-158776 | * | 12/1979 |
| JP | 8-20871 | | 1/1996 |
| JP | 8-27562 | | 1/1996 |
| WO | WO 95/02709 | | 1/1995 |
| WO | 99 23275 A | | 5/1999 |

OTHER PUBLICATIONS

Database WPI, Section CH, Week 197913, Derwent Publications Ltd., London,, GB; Class L02, AN 1979–24767B, XP002188606 of JP 54 023608 A (Sumitomo Electric IND CO), Feb. 22, 1979.

Patent Abstracts of Japan, vol. 1996, No. 05, May 31, 1996 of JP 08 020871 A (Toshiba Tungaloy CO LTD), Jan. 23, 1996.

Patent Abstracts of Japan, vol. 1996, No. 05, May 31, 1996 of JP 08 027562 A(Toshiba Tungaloy Co. LTD), Jan. 30, 1996.

* cited by examiner

Primary Examiner—Archene Turner
(74) Attorney, Agent, or Firm—Frishauf, Holtz, Goodman, Langer & Chick, P.C.

(57) ABSTRACT

For coating a cutting tool with an aluminum oxide layer, a bonding layer has been provided that is preferably formed by aluminum titanate and has a flake-like crystal structure. This bonding layer improves the adherence of an aluminum oxide layer, in particular to underlying titanium nitride, titanium carbide, or titanium carbonitride layers.

19 Claims, 5 Drawing Sheets

CUTTING TOOL WITH MULTILAYER, WEAR-RESISTANT COATING

BACKGROUND OF THE INVENTION

The invention relates to a cutting tool or cutting insert and to a method for producing a cutting insert or a cutting tool which has a wear-resistant coating built up in multiple layer.

Cutting tools are subject to various stresses in operation that over time lead to wear. Wear means both the wearing down of chip faces and flanks and breakage of cutting edges. Furthermore, under conditions of heavy stress high temperatures also occur, which can cause diffusion wear and oxidation wear of edges and faces of the cutting tool. To reduce wear especially at high machining capacities, various coatings of cutting tools or cutting inserts have been developed.

For example, from European Patent Disclosure EP 0 786 536 A1, a hard metal cutting insert is known that is provided with a multilayer coating. The coating has a thickness of 3 to 20 $\mu$m and is formed on a hard metal body by chemical or physical vapor deposition processes (CVD or PVD). The coating contains an aluminum oxide layer with a very low proportion of chlorine.

The aluminum oxide layer has a relatively great hardness. It also acts as an oxidized surface layer and at the same time as an oxidation protectant for underlying layers and is thus especially well suited to tools that are subject to tribochemical attack. It acts as a protectant against tribochemical wear processes such as diffusion and oxidation and also acts as thermal insulation and thus protects against plastic deformation.

European Patent Disclosure EP 0 736 615 A2 also proposes an aluminum oxide layer as an outermost layer of a multilayer coating of a cutting tool. Between the aluminum oxide layer and the actual hard metal body, a plurality of layers acting as intermediate coatings or underlying layers are formed. The substrate layer that is in immediate contact with the aluminum oxide layer is a titanium carbonitride oxide layer with a thickness of between 0.1 and 2 $\mu$m and a needle-like crystal structure. Under this layer, one or more layers with a columnar crystal structure, composed of the same chemical elements, are formed.

The adherence of the aluminum oxide layer to the substrate is one essential factor. It is especially stressed upon plastic deformation and in interrupted cutting (milling, turning on a lathe, drilling) of steel and casting materials, especially such high-strength materials as 42CrMo4V and 56NiCrMoV7.

To improve the adherence of an aluminum oxide layer to the applicable underlying layers, U.S. Pat. No. 5,958,569 proposes a titanium carbonitride bonding layer between an outer aluminum oxide layer and a titanium nitride layer located beneath it. The bonding layer is meant to form interlocking microscopic fingers between the oxide coating and the metal carbonitride coating.

With this as the point of departure, it is the object of the invention to improve the adherence of an oxide layer (preferably an aluminum oxide layer) to underlying layers in cutting tools, cutting inserts, or the like.

This object is attained by the present invention.

The Periodic Table groups refer especially to the following elements: (the heavier elements of these groups not listed here would normally not be used):

Group III: B, Al, Sc, Y, In, La and Tl;
Group IV : C, Si, Ti, Ge, Zr, Sn, Hf and Pb;
Group V : N, P, V, As, Nb, Sb, Ta and Bi; and
Group VI: O, S, Cr, Se, Mo, The, W and Po.

BRIEF DESCRIPTION OF THE INVENTION

The machining tool and cutting insert according to the invention have an aluminum oxide layer, which is retained on the underlying coatings by means of a bonding layer. The underlying coating is for example a titanium nitride, titanium carbide, or titanium carbonitride layer, and in addition to or in place of the titanium, the layer can also contain still other metals of Group IV, V or VI of the periodic system of Chemical Elements. The bonding layer firmly holds the aluminum oxide layer on the substrate and thus prevents or inhibits abrasion or breakage, flaking off or peeling off of the aluminum oxide layer. The improved adherence of the aluminum oxide layer to the substrate allows a heavier load on the machining tool or cutting insert and a longer service life thereof possible.

DETAILED DESCRIPTION OF THE INVENTION

The weight content used herein to describe the invention is atomic %.

An important feature of the invention is the bonding layer. The bonding layer contains a metal of Group IV, V or VI of the periodic system of Chemical Elements and an element of the Group III of the periodic system, such as boron or aluminum as well as carbon and/or nitrogen and/or oxygen. It has been found that the presence of a second element of the Group III along with the metal of Group IV, V or VI (such as titanium) can improve the adherence of the oxide layer. In particular, it has proved to be expedient to provide titanium and aluminum in the bonding layer. The titanium component should predominate, and the aluminum component should be rather slight (e.g. dopant quantity). The bonding layer thus forms crystals that can grow solidly, or merge with, the crystals of the aluminum oxide layer located above. The aluminum oxide layer is thus to a certain extent rooted in the bonding layer. This can be achieved in particular if the bonding layer is a layer, in which the aluminum content is at most about 4%, preferably 0.1 to 4%, most preferably 0.5% to 3% and best at 0.5 to 2% and the oxygen content is about 0.1 to 6%. Aluminum titanate, which enables good adherence to the aluminum oxide layer, can thus form in the bonding layer. In addition, the bonding layer can contain relatively larger proportions of titanium carbonitride.

A preferred bonding layer is one characterized in that it is a Ti—Al—C—N—O layer wherein Ti($C_xN_y$) forms a matrix wherein Al TiO is dispersed throughout. The Al content is as indicated above. The aluminum is preferably in the form of aluminum titanate ($Al_2TiO_3$).

The bonding layer is preferably relatively thin, specifically markedly thinner than the aluminum oxide layer and the underlying coating. Layer thicknesses of 0.1 to 3 µm are considered advantageous. The layer thickness is preferably 1 µm.

The metal of the underlying coating is preferably titanium, but the other metals named can also be used, individually or in mixtures with titanium or with one another.

The underlying coating can in turn be built up in multiple layers and can for example include a titanium nitride layer approximately 0.5 µm thick and/or a titanium carbonitride layer 1 to 16 µm thick. In addition, carbon and/or oxygen, for example, can be present as contaminants, originating for example in the underlying coating material or other sources. The underlying coating is preferably a layer created by the medium-temperature method. The bonding layer allows the solid connection of this medium-temperature layer (base layer) and the aluminum oxide layer. The aluminum oxide layer can be built up as an α-aluminum oxide or as a κ-aluminum oxide or as an oxide layer that contains multiple modifications.

The bonding layer preferably has a flake-like or whisker-like laminated crystal structure. The flake-like crystals of the bonding layer leave interstices open into which the aluminum oxide layer can grow and in which, as a result of the aluminum content of the bonding layer, nucleation nuclei are already present for the aluminum oxide layer being grown. An intimate connection can thus be obtained between the aluminum oxide layer and the bonding layer and thus between the aluminum oxide layer and the substrate. It has been demonstrated that the oxidation potential of the reaction gas mixture, in the deposition of the aluminum oxide layer before and during the nucleation phase need not be kept excessively low. The content of water and other oxidants is not so critical because of the bonding layer, which already contains nucleation nuclei for the aluminum oxide layer.

The bonding layer contains quite a large number of nucleation nuclei, or acts with its structures like a large number of nucleation nuclei. In the subsequent deposition of the $Al_2O_3$ layer, this brings about an especially fine-crystalline embodiment of this layer. For a layer thickness of about 6 µm, particle widths as low as only 1 to 1.5 µm are achieved.

Further details of advantageous embodiments of the invention are the subject of the drawings as described below.

Figure 1:
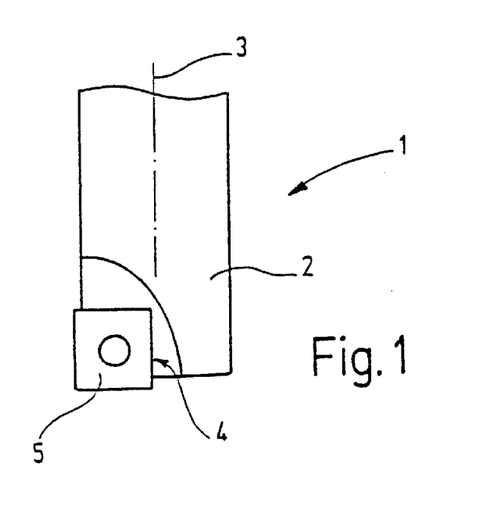
FIG. 1, in a side view, a cutting tool with a multilayer-coated cutting insert.

One exemplary embodiment of the invention is shown in the drawings as described below:

In FIG. 1, a machining tool 1 is shown in detail, as an example. The machining tool 1 is an end-milling cutter with a tool base body 2 that in operation rotates about an axis of rotation 3. On its front end, it has a cutting insert seat 4, on which a cutting insert 5 is retained. By way of example, this cutting insert 5 is a hard metal cutting insert, for instance a tungsten carbide and cobalt hard metal cutting insert. Other substrate materials, such as HSS, sintered ceramics or cermets, hard metals carbides or mixed carbides, or the like are other examples of other known substrate materials which can be used. The hard metal cutting insert 5 has a wear-reducing coating 6, shown schematically in FIG. 2. The coating 6 adheres to a hard metal base body 7 and covers it both on the cutting edges and on other functionally determining faces, such as the chip face and the flank.

Figure 2:
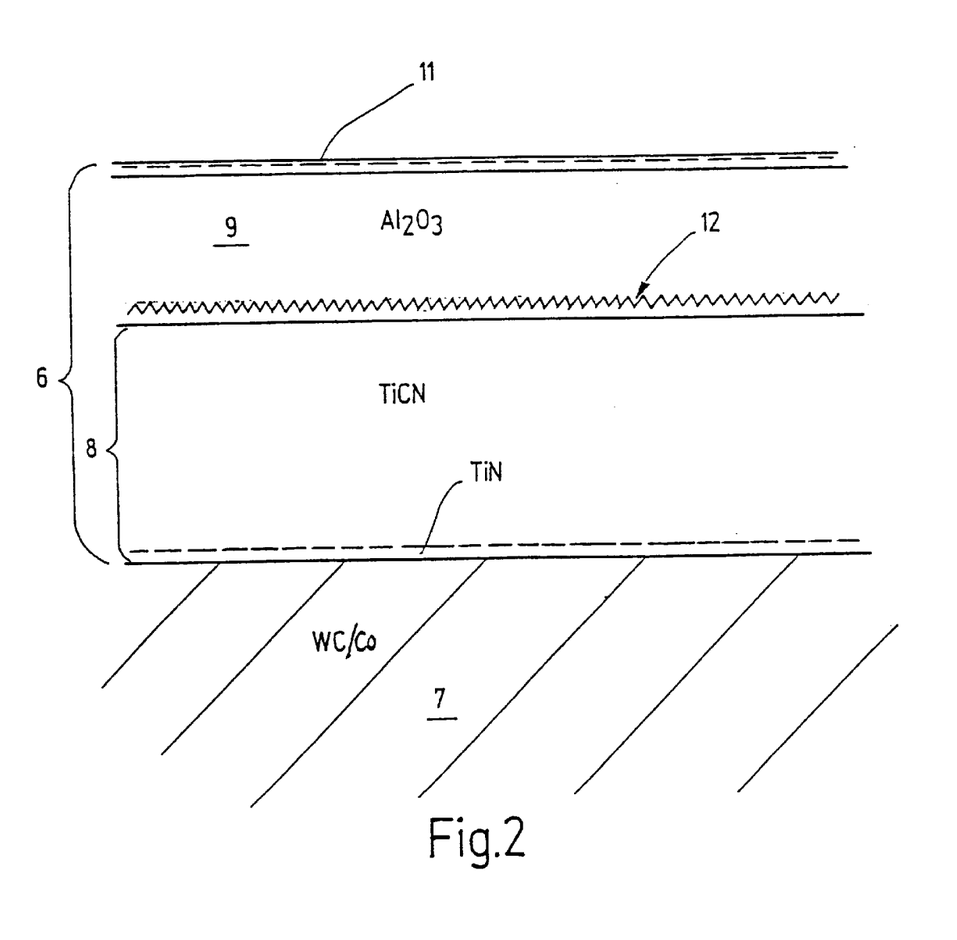
FIG. 2, in an enlarged sectional view, the layer structure of wear-protection layers of the cutting insert of the cutting tool of FIG. 1.

The wear-reducing coating 6 includes a substrate 8, built up in one or more layers, which has been deposited at least for the most part by the medium-temperature method. For example, the substrate 8 is substantially a titanium carbonitride layer (TiCN) with a columnar crystal structure and a thickness of 1 to 16 µm. Between the titanium carbonitride layer and the tungsten carbide (WC) substrate material, there can be a titanium nitride layer (TiN) approximately 0.1 µm to 1 µm and preferably 0.5 µm thick.

To protect the intrinsically hard, wear-resistant titanium carbonitride layer from oxidative and diffusive wear, as can occur for example in turning on a lathe or in milling, the wear-reducing coating 6 contains an aluminum oxide layer 9 above the substrate 8. The aluminum oxide layer 9 can be κ-aluminum oxide, α-aluminum oxide, or can be different from one region to another or mixed κ/α-aluminum oxide. The aluminum oxide layer 9 can if needed also have a cover layer 11 built up in one or more layers, for example comprising a compound of an element of Group IV, V or VI (Hf, Zr, Ti) with carbon, nitrogen and/or boron, or zirconium dioxide, aluminum oxide, boron nitride, boron carbide, titanium nitride, titanium carbide, or titanium carbonitride, or other compounds.

Figure 3:
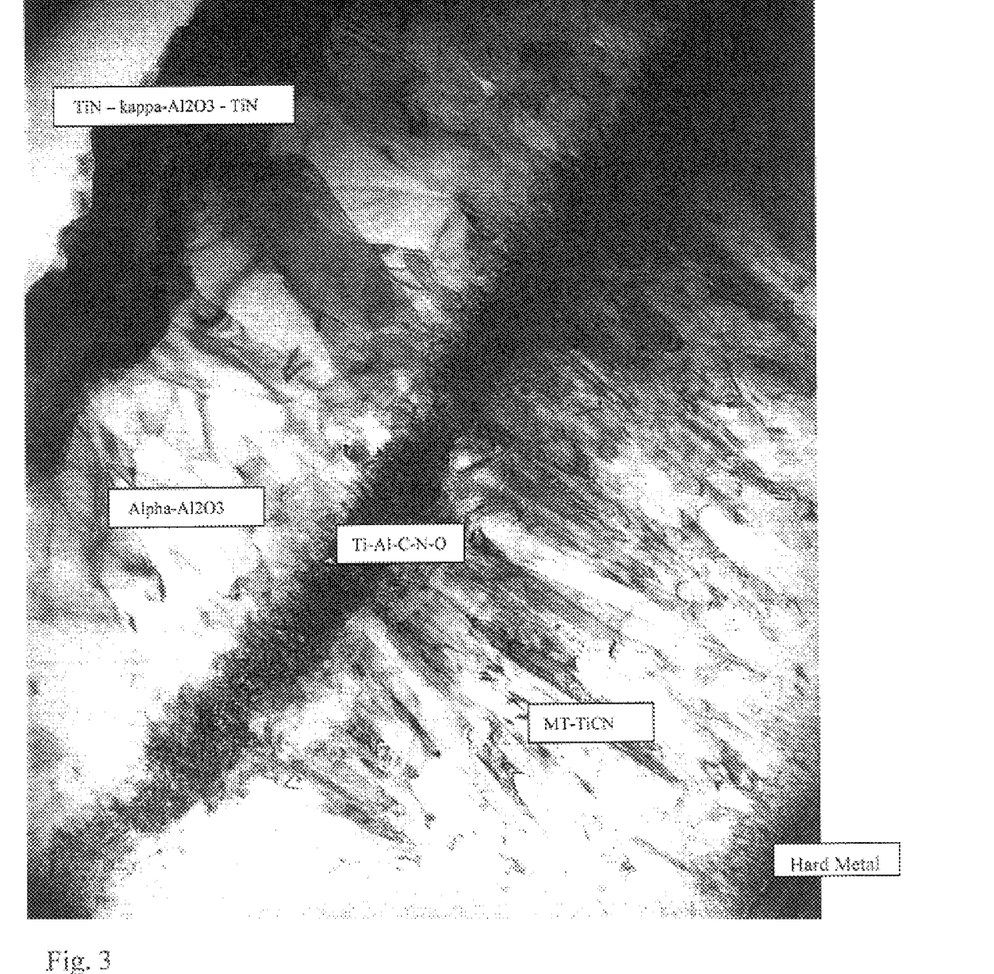
FIG. 3, a transmission electron micrograph of the layer structure of FIG. 2.
Figure 4:
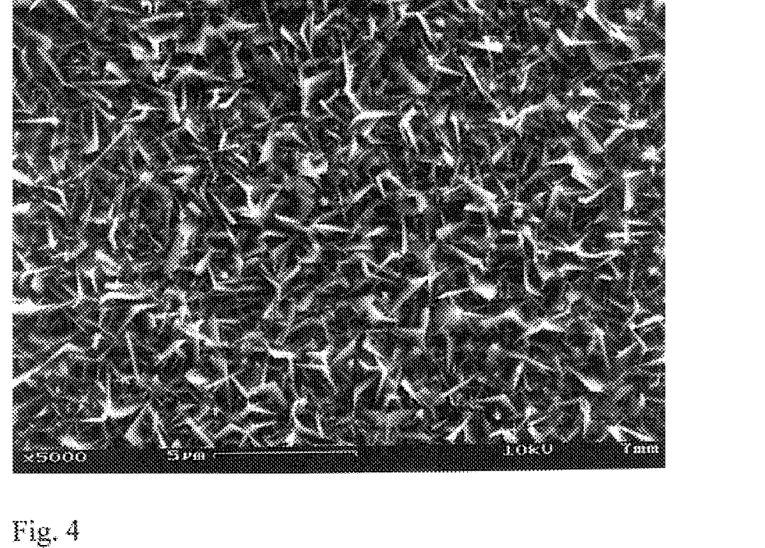
FIG. 4, an electron micrograph of the bonding layer in a plan view enlarged 5000 times.
Figure 5:
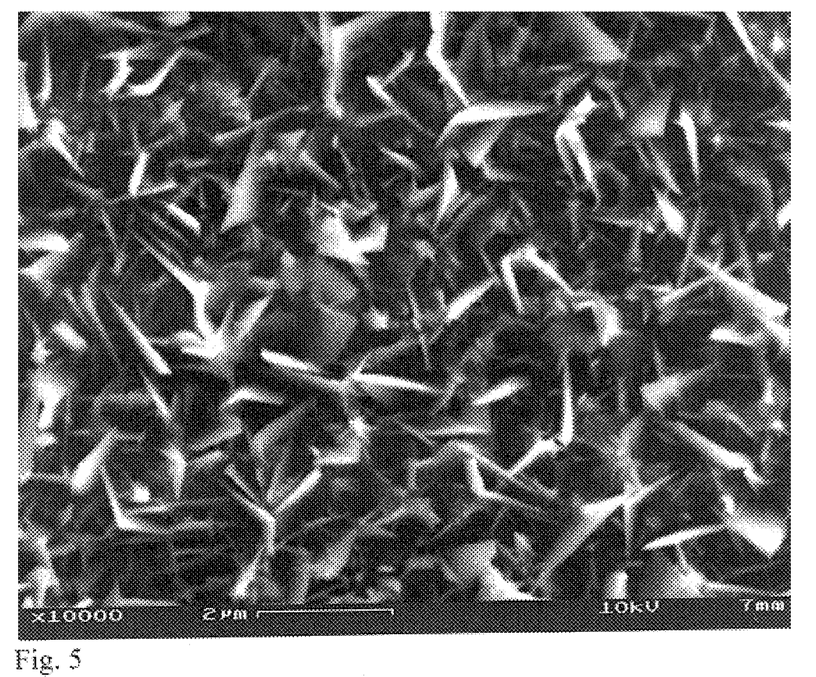
FIG. 5, the bonding layer of FIG. 4 in a scanning electron micrograph enlarged 10000 times.

Besides its substrate ingredients of titanium, carbon and nitrogen, the substrate 8 contains what are sometimes hardly unavoidable contaminants, which can originate in the substrate material or adhere to the process gases, such as oxygen. Contaminants from cobalt, for instance, which can originate in the substrate material, preferentially diffuse along the crystal or particle boundaries and can thus, beginning at the substrate material, penetrate through the entire base layers. In order nevertheless to attain good adherence of the aluminum oxide layer 9 to the substrate 8 under all conditions, a bonding layer 12 is provided between them; its thickness can be defined to be in the range from 0.1 to 3 µm. In this case, the bonding layer is a titanium aluminum carbonitride oxide layer Ti—Al—C—N—O, whose structure can be seen in FIGS. 3–5. As FIG. 3 shows, the Ti—Al—C—N—O layer 12 is grown on the substrate 8, which has a columnar structure, and on its top side toward the aluminum oxide layer, it has a surface that is fissured to the extreme. The surface structure of the Ti—Al—C—N—O layer 12 is shown in FIGS. 4 and 5. It has a flake-like crystal structure, and there are pores and interstices between individual crystallites. As the aluminum oxide layer continues to be applied, the crystal growth of the aluminum oxide layer begins in these pores and interstices and thus gains excellent bonding.

As also shown in FIG. 3, the cover layer 11 is for example built up in multiple layers as well and includes a Ti—N layer, a κ-aluminum oxide layer, and another Ti—N layer. The result is accordingly the following layer structure:

1. TiN, 0.1 to 2 µm
2. (Moderate Temperature)—(Ti, C, N) substrate, 1 to 16 µm, deposited in a temperature range of 700° C. to 900°
3. bonding layer Ti—Al—C—N—O, 0.1 to 3 µm
4. α- or κ-aluminum oxide layer $Al_2O_3$, 0.5 to 12 µm
5. TiN, 0.1 to 2 µm
6. Optionally, additional layers totalling 0.1 to 2 µm in thickness, TiN—κ—$Al_2O_3$—TiN, TiCN/TiN, Ti—B—C—N, HfN, HfCN, or the like.

Examples shown in the following Tables generally follow these steps:

|  | Step 1 | Step 2 | Step 3 | Step 4 | Step 5 | Step 6 | Step 7 |
|---|---|---|---|---|---|---|---|
| EXAMPLE 1 | | | | | | | |
| layer | TiN | MT-TiCN | TiAlCNO | alpha-Al$_2$O$_3$ | TiN | kappa-Al2O3 | TiN |
| Thickness [μm] | 0.5 | 8 | 1 | 6 | 0.3 | 0.3 | 0.5 |
| Duration [min] | 60 | 320 | 40 | 270 | 20 | 20 | 50 |
| Pressure [mbar] | 160 | 90 | 100 | 65 | 100 | 65 | 800 |
| Temperature [° C.] | 900 | 885 | 1015 | 1015 | 1015 | 1015 | 1015 |
| gas flowrate [1/min] | | | 36 | | | | |
| TiCl$_4$[%] | X | X | 0.9 | | X | | X |
| CH$_3$CN[%] | | X | — | | | | |
| CH$_4$[%] | | | 2.8 | | | | |
| N$_2$[%] | X | | 2.8 | | X | | X |
| CO[%] | | | 1.1 | | | | |
| CO$_2$[%] | | | — | X | | X | |
| H$_2$S[%] | | | | X | | X | |
| AlCl$_3$[%] | | | 0.7 | X | | X | |
| H$_2$[%] | X | X | balance | X | | X | |
| EXAMPLE 2 | | | | | | | |
| layer | TiN | MT-TiCN | TiAlCNO | alpha-Al$_2$O$_3$ | | | |
| Thickness [μm] | 0.5 | 4 | 0.8 | 3.5 | | | |
| Duration [min] | 60 | 150 | 40 | 155 | | | |
| Pressure [mbar] | 160 | 90 | 100 | 65 | | | |
| Temperature [° C.] | 900 | 885 | 1015 | 1015 | | | |
| gas flowrate [1/min] | | | 36 | | | | |
| TiCl$_4$[%] | X | X | 0.8 | | | | |
| CH$_3$CN[%] | | X | — | | | | |
| CH$_4$[%] | | | 2.7 | | | | |
| N$_2$[%] | X | | 5.5 | | | | |
| CO[%] | | | 1.1 | | | | |
| CO$_2$[%] | | | — | X | | | |
| H$_2$S[%] | | | | X | | | |
| AlCl$_3$[%] | | | 0.7 | X | | | |
| H$_2$[%] | X | X | balance | X | | | |

The coating described thus far can be formed as follows:

First, following usual procedures, at a deposition temperature of 700° C. to 1000° C., on a suitable substrate material such as tungsten carbide or other sintering material, the substrate 8 is formed. Acetonitrile or a mixture of a nitrogen and alkanes is used for example as a carbon and nitrogen donor. The substrate usually grows with a columnar crystal structure.

In the next method step, the bonding layer is formed. To that end, the cutting tool or cutting insert 5 is placed, at a temperature of between 900° C. and 1100° C. (preferably about 1000° C.), in an atmosphere that contains precursors for aluminum and titanium. These precursors can be titanium tetrachloride and aluminum trichloride. As a carbon donor, the atmosphere contains methane or another alkane or acetonitrile (CH$_3$CN), or other nitrites. The atmosphere also contains molecular nitrogen as well as an oxygen donor, such as carbon monoxide or carbon dioxide. As a carrier gas, hydrogen can be employed.

Figure 3A:
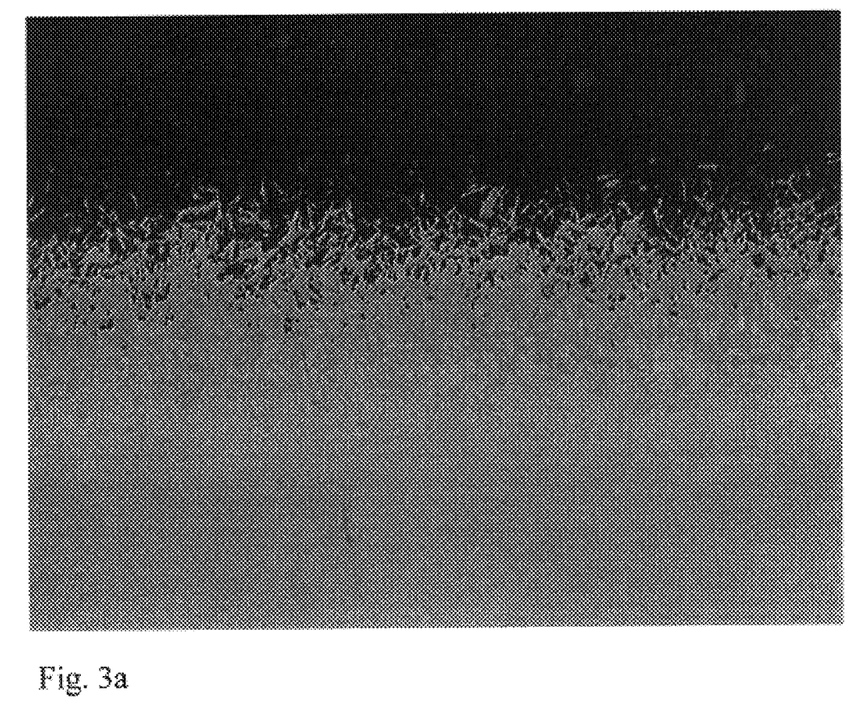
FIG. 3a, an optical micrograph of the bonding layer of FIG. 3, ground obliquely.
Figure 6:
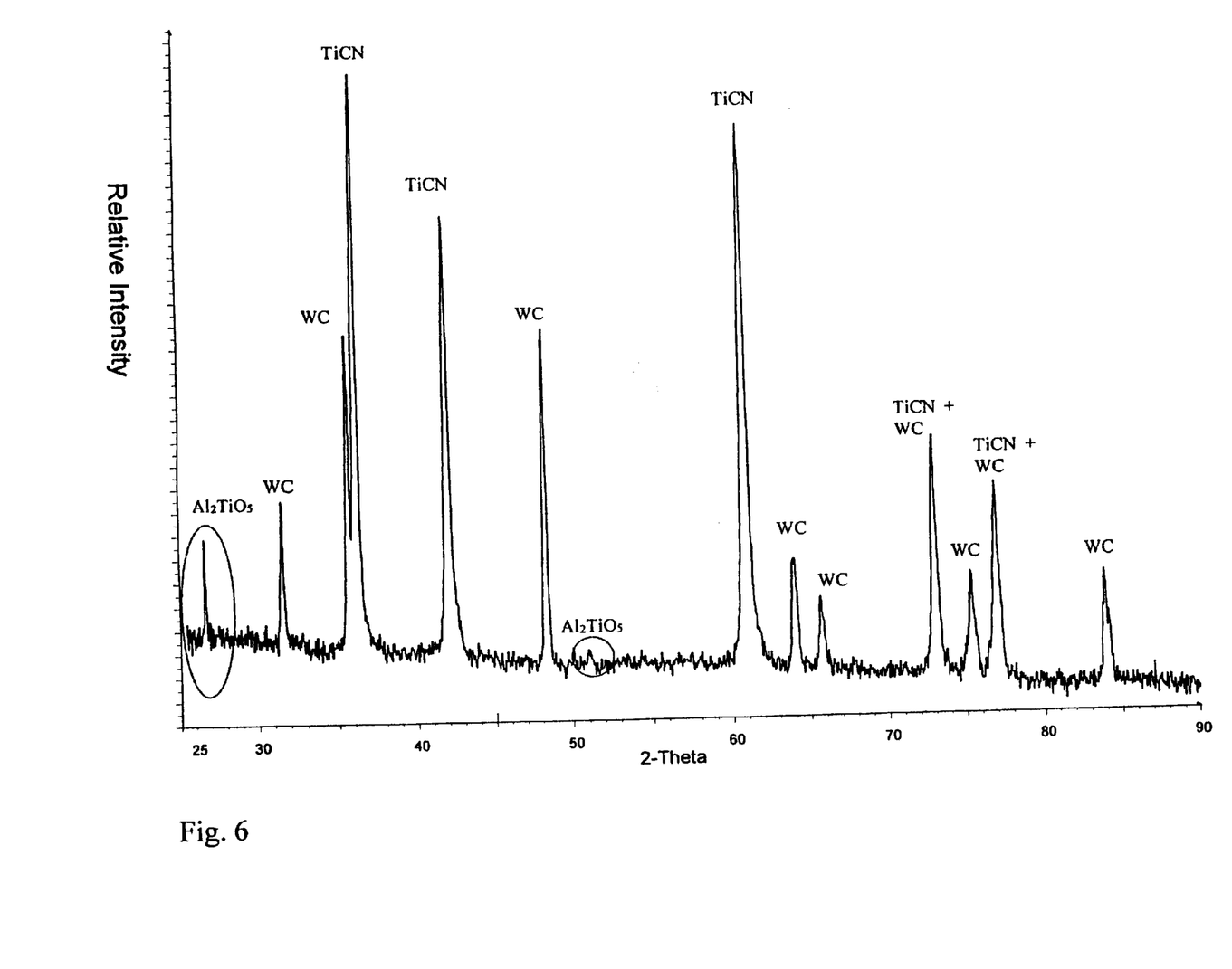
FIG. 6, an x-ray spectrograph, derived from the layer structure of FIG. 3, of a layer sequence up to a bonding layer designed to be thicker (3 $\mu$m).

Aluminum trichloride is added in lesser quantities, while titanium tetrachloride is present in comparatively greater quantities. As a result, the bonding layer 12 grows with the structure shown in FIGS. 4 and 5. In FIG. 3a, an oblique ground section of a finished indexable cutting insert is shown. It has the spongelike porous structure, which thins out more and more toward the surface, of the bonding layer. X-ray spectroscopic examinations of the coating, the results of which are shown in FIG. 6, show both the substrate material, that is, tungsten carbide (WC—Co), and the existing titanium carbonitride layers (Ti, C, N) and aluminum titanate (Al$_2$TiO$_5$). Aluminum titanate (Al$_2$TiO$_5$) and the titanium carbonitride (TiC$_x$N$_y$; x+y=1; x=0 to 1; i.e. carbon may be absent), preferably x>0.3, most preferably x>0.5 and y<0.5; with best results wherein x>0.7 and y<0.3) are present in the form of macroscopic crystals next to one another. The TiC$_x$N$_y$ forms a matrix representing at least 94% of the layer within which the Ti—Al—C—N—O component (e.g. AlTiO) is scattered. In an advantageous embodiment, the layer comprises titanium carbonitride with a cubic lattice and nitrogen in one-third of all the carbon spaces. This lattice is oxygen-free. The oxygen is then completely bound in the aluminum titanate crystals. These crystals are in the form of pseudo-brookite.

In the pseudo-brookite structure, which is a modification of titanium oxide (TiO$_2$), some of the titanium atoms have been exchanged for aluminum atoms. The oxygen is present preferably in an amount of 0.1 to 6%, of the Al$_2$O$_3$+TiO$_2$ pseudobrookite structure Both types of metal atoms are surrounded, distorted octahedrally, by oxygen atoms, so that preferably there is no macroscopic mixing of titanium oxide crystals and aluminum oxide crystals; instead, a uniform crystal structure is present, which can be derived from pure brookite (TiO$_2$). Relatively large regions of the intermediate layer can comprise pure titanium carbonitride. The result is virtually optimal mediation between the aluminum oxide layer and the titanium carbonitride layer. The aluminum titanate regions can be relatively small, and the desired effect is already obtained with dopant quantities of aluminum of less than 2% (most preferably 0.5 to 2%). The bonding layer creates an epitaxial relation between the substrate and the $Al_2O_3$ layer. The bonding layer presents no obstacle to a resultant epitaxial connection between the basic layer and the $Al_2O_3$ layer.

Machining tests and an adhesion test have been performed on suitably produced layers and with corresponding cutting tools. If the layer according to the invention is subjected to a layer adherence test (scratch test), a quite considerably improved adherence of the layer structure according to the invention is demonstrated, which is also an indication of improved adherence of the aluminum oxide layer. The machining tests also show improved stability of the tools and an improved adherence of the aluminum oxide layer, both in the case of κ- and in the case of α-aluminum oxide layers.

For coating a cutting tool with an aluminum oxide layer, a bonding layer has been provided that is preferably formed by aluminum titanate and has a laminated or flake-like crystal structure. This bonding layer improves the adherence of an aluminum oxide layer, in particular to underlying titanium nitride, titanium carbide, or titanium carbonitride layers.

Embodiments of the invention also include:
1. A machining tool (1), in particular for interrupted cutting and/or high operating temperatures,
   having at least one cutting body (5), which is provided at least regionally with a wear-reducing multilayer coating (6), which is applied to a substrate material (7), and the coating (6) in turn contains at least the following layers built up in single or multiple layer:
   a substrate (8), which is a nitride, carbide or carbonitride layer of one or more metals of Group IV, V or VI of the periodic system of Chemical Elements,
   a bonding layer (12), which contains a metal of Group IV, V or VI and an element of the Group III of the periodic system of Chemical Elements and at least one nonmetal that belongs to the group comprising carbon, nitrogen, and oxygen,
   an oxide layer (9), which substantially contains aluminum oxide.
2. A cutting insert (5), in particular for interrupted cutting and/or high operating temperatures, which is provided at least regionally with a wear-reducing multilayer coating (6), which is applied to a substrate material (7), and the coating (6) in turn contains at least the following layers built up in single or multiple layer:
   a substrate (8), which is a nitride, carbide or carbonitride layer of one or more metals of Group IV, V or VI of the periodic system of Chemical Elements,
   a bonding layer (12), which contains a metal of Group IV, V or VI and an element of the Group III of the periodic system of Chemical Elements and at least one nonmetal that belongs to the group comprising carbon, nitrogen, and oxygen,
   an oxide layer (9), which substantially contains aluminum oxide.
3. A cutting tool or cutting insert of embodiment 1 or 2, characterized in that the bonding layer (12) has a crystal structure with flake-like crystallites.
4. A cutting tool or cutting insert of embodiment 1 or 2, characterized in that the element of the Group III of the periodic system (IIIa) of the bonding layer (12) is aluminum (Al).
5. A cutting tool or cutting insert of embodiment 1 or 2, characterized in that the bonding layer (12) is a Ti—Al—C—N—O layer, where Ti($C_xN_y$) forms a matrix with and Al TiO is a scattered into this matrix, wherein the Al-control is preferably 0.1% to 4%, most preferably 0.5% to 3% and best at 0.5% to 2%.
6. A cutting tool or cutting insert of embodiment 1 or 2, characterized in that the bonding layer (12) contains aluminum titanate ($Al_2TiO_5$).
7. A cutting tool or cutting insert of embodiment 1 or 2, characterized in that the bonding layer (12) contains titanium carbonitride TiCN.
8. A cutting tool or cutting insert of embodiment 1 or 2, characterized in that the bonding layer (12) has a layer thickness of 0.1 to 3 $\mu$m, preferably 1 $\mu$m.
9. A cutting tool or cutting insert of embodiment 1 or 2, characterized in that the metal of the substrate (8) is titanium (Ti).
10. A cutting tool or cutting insert of embodiment 1 or 2, characterized in that the substrate (8) is built up in multilayer fashion and contains a TiN layer, whose thickness is preferably no greater than 0.5 $\mu$m, and this layer can include unavoidable traces or contaminants of carbon (C) and/or oxygen (O).
11. A cutting tool or cutting insert of embodiment 1 or 2, characterized in that the substrate (8) is built up in multilayer fashion and contains a TiCN layer, whose thickness is preferably in the range of 1 to 16 $\mu$m, and this layer can include unavoidable traces or contaminants of oxygen (O).
12. A cutting tool or cutting insert of embodiment 1 or 2, characterized in that the substrate (8) is a layer or layer sequence produced by the medium-temperature method.
13. A cutting tool or cutting insert of embodiment 1 or 2, characterized in that the oxide layer (9) contains α-aluminum oxide.
14. A cutting tool or cutting insert of embodiment 1 or 2, characterized in that the oxide layer (9) contains κ-aluminum oxide.
15. A cutting tool or cutting insert of embodiment 1 or 2, characterized in that one or more further layers (11) are applied to the oxide layer (9).
16. The cutting tool or cutting insert of embodiment 15, characterized in that a TiN layer, a κ-aluminum oxide layer and a TiN layer comprise the further layers (11).
17. The cutting tool of embodiment 1, characterized in that the machining tool (1) has at least one cutting insert (5) of claim 2.
18. A coating, in particular for a cutting tool, wherein the coating contains aluminum titanate.
19. A method for producing a cutting insert (5) or machining tool (1) with a wear-reducing coating (6) that contains two different layers (8, 9), of which one contains TiC and/or TiCN and another contains $Al_2O_3$, and between the layers (8, 9) a bonding layer (12) on the basis of titanium aluminum carbonitride oxide Ti—Al—C—N—O is embodied, and in the method, after the TiC and/or TiCN layer is made, the Ti—Al—C—N—O bonding layer is formed in a CVD process at a temperature or a temperature course that is between 900° and 1100° C., using a halogenated titanium compound and a halogenated aluminum compound as a precursor, one or more gases selected from the group comprising alkanes or alkane compounds as a carbon donor, carbon monoxide and/or carbon dioxide as an oxygen donor, and hydrogen as a carrier gas.

20. The method of embodiment 19, characterized in that as the carbon and nitrogen donor, a nitrile compound is used in addition to or as a substitute for the alkanes or alkane compounds and the nitrogen.

It will be appreciated that the instant specification is set forth by way of illustration and not limitation and that various modifications and changes may be made without departing from the spirit and scope of the present invention.

What is claimed is:

1. A wear-reducing multilayer coating for a cutting edge of a cutting body or cutting insert for use in a machining or cutting tool (1), in particular for interrupted cutting and/or high operating temperatures, the cutting edge being provided at least regionally with the wear-reducing multilayer coating (6), which is applied to a substrate material (7), the wear-reducing coating (6) containing at least the following layers built up in single or multiple layers:

a substrate (8), which is a nitride, carbide or carbonitride layer of one or more metals of Group IV, V or VI of the periodic system of Chemical Elements, a bonding layer (12), which is a Ti—Al—C—N—O layer having a flake crystallite structure and where $Ti(C_xN_y)$ forms a matrix and AlTiO is dispersed throughout this matrix, wherein the Al-content is 0.1% to 4% and X+Y=1 with X=0 to 1, and an oxide layer (9), which substantially contains aluminum oxide.

2. A cutting insert (5), having a cutting edge and wherein the wear-resistant multilayer coating of claim 1 is provided at least regionally on its cutting edge.

3. A machining tool (1) comprising at least one cutting insert (5) of claim 2.

4. A cutting tool (1) having a cutting edge and wherein the wear-resistant multilayer coating of claim 1 is provided at least regionally on its cutting edge.

5. A coating of claim 1, wherein the element of Group III of the periodic system of the bonding layer (12) is aluminum (Al).

6. A coating of claim 1, wherein the Al-content is 0.5% to 3%.

7. A coating of claim 1, wherein the Al-content is 0.5 to 2%.

8. A coating of claim 1, wherein the bonding layer (12) contains aluminum titanate ($Al_2TiO_5$) and titanium carbonitride (TiCN).

9. A coating of claim 1, wherein the bonding layer (12) has a layer thickness of 0.1 to 3 $\mu$m.

10. A coating layer of claim 1, wherein the bonding layer (12) has a layer thickness of 1 $\mu$m.

11. A coating of claim 1, wherein the metal of the substrate (8) is titanium (Ti).

12. A coating of claim 1, wherein the substrate (8) is built up in multilayer fashion and contains a TiN layer, whose thickness is preferably no greater than 0.5 $\mu$m, and this layer can include unavoidable traces or contaminants of carbon (C) and/or oxygen (O).

13. A coating of claim 1, wherein the substrate (8) is built up in multilayer fashion and contains a TiCN layer, whose thickness is preferably in the range of 1 to 16 $\mu$m, and this layer can include unavoidable traces or contaminants of oxygen (O).

14. A coating of claim 1, wherein the substrate (8) is a layer or layer sequence produced by the medium-temperature method.

15. A coating of claim 1, wherein the oxide layer (9) contains α-aluminum oxide.

16. A coating of claim 1, wherein the oxide layer (9) contains κ-aluminum oxide.

17. A coating of claim 1, wherein one or more further layers (11) are applied to the oxide layer (9).

18. A coating of claim 17, wherein the one or more further layers (11) are a TiN layer, a κ-aluminum oxide layer and a TiN layer.

19. A coating of claim 1, wherein the bonding layer (12) contains aluminum titanate.

* * * * *